United States Patent [19]

Uenishi et al.

[11] Patent Number: 5,153,096

[45] Date of Patent: Oct. 6, 1992

[54] POSITIVE TYPE PHOTORESIST COMPOSITION COMPRISING AS A PHOTOSENSITIVE INGREDIENT A DERIVATIVE OF A TRIPHENYLMETHANE CONDENSED WITH AN O-QUINONE DIAZIDE

[75] Inventors: Kazuya Uenishi; Yasumasa Kawabe; Tadayoshi Kokubo, all of Shizuoka, Japan

[73] Assignee: Fuji Photo Film Co., Ltd., Kanagawa, Japan

[21] Appl. No.: 670,513

[22] Filed: Mar. 18, 1991

Related U.S. Application Data

[63] Continuation of Ser. No. 301,763, Jan. 26, 1989, abandoned.

[30] Foreign Application Priority Data

Jan. 26, 1988 [JP] Japan .................. 63-14898

[51] Int. Cl.$^5$ .................. G03F 7/022; G03F 7/023
[52] U.S. Cl. .................. 430/192; 430/165; 430/193; 534/556; 534/557
[58] Field of Search .................. 430/192, 193, 165; 534/556, 667

[56] References Cited

U.S. PATENT DOCUMENTS

| | | |
|---|---|---|
| 3,188,210 | 6/1985 | Fritz et al. .................. 430/193 |
| 4,407,926 | 10/1983 | Stahlhofen .................. 430/193 |
| 4,424,270 | 1/1984 | Erdman et al. .................. 430/193 |
| 4,517,275 | 5/1985 | Stahlhofen .................. 430/193 |
| 4,555,469 | 11/1985 | Erdman et al. .................. 430/133 |
| 4,732,836 | 3/1988 | Potuin et al. .................. 430/193 |
| 4,732,837 | 3/1988 | Potuin et al. .................. 430/193 |
| 4,812,551 | 3/1989 | Oi et al. .................. 430/193 |
| 4,837,121 | 6/1989 | Blakeney et al. .................. 430/193 |

FOREIGN PATENT DOCUMENTS 227487 7/1987 European Pat. Off. .................. 430/193

OTHER PUBLICATIONS

English translation of Japanese Publication #60-121,445, Published Jun. 28, 1985, (Hosaka et al.).

*Primary Examiner*—Richard L. Schilling
*Assistant Examiner*—John S. Chu
*Attorney, Agent, or Firm*—Sughrue, Mion, Zinn Macpeak & Seas

[57] ABSTRACT

A positive type photoresist composition comprising at least one light-sensitive material, as defined herein, and an alkali-soluble novolak resin, has a high resolving power, particularly when used in semiconductor devices, accurately reproduces mask dimensions over a wide photomask line width range, from a resist pattern in a cross-sectional form having a high aspect ratio in a pattern having a line width of no greater than 1 μm, has a wide developing latitude and excellent heat resistance.

6 Claims, No Drawings

POSITIVE TYPE PHOTORESIST COMPOSITION COMPRISING AS A PHOTOSENSITIVE INGREDIENT A DERIVATIVE OF A TRIPHENYLMETHANE CONDENSED WITH AN O-QUINONE DIAZIDE

This is a Continuation of application Ser. No. 07/301,763 filed Jan. 26, 1989, now abandoned.

FIELD OF THE INVENTION

The present invention relates to a positive type photoresist composition which is sensitive to radiation. More particularly, it relates to a photoresist composition for minute working which has high resolving power and sensitivity and further, has a good cross-sectional form of pattern.

BACKGROUND OF THE INVENTION

A composition containing an alkali-soluble resin and a naphthoquinonediazide compound as a light-sensitive material is generally used as a positive type photoresist composition. For example, a "novolak type phenol resin/naphthoquinonediazide-substituted compound" is described in U.S. Pat. Nos. 3,666,473, 4,115,128 and 4,173,470, and a "novolak resin comprising cresol and formaldehyde/trihydroxybenzophenone-1,1-naphthoquinonediazido-sulfonic acid ester", which is the most typical example, is described in L.F. Thompson, Introduction to Microlithography, ACS Publication Corp., No. 219, pp. 112–121.

Further, triphenylmethane-based light-sensitive material is known as is described in U.S. Pat. No. 3,188,210 and JP-A-60-121445 (The term "JP-A" as used herein means an "unexamined published Japanese patent application").

A novolak resin as a binder is particularly useful in that it is soluble in an aqueous alkali solution without swelling, and when the formed image is used as an etching mask, it provides high durability, particularly against plasma etching. The naphthoquinonediazide compound to be used as a light-sensitive material is specific in that although the naphthoquinonediazide compound itself acts as a dissolution inhibitor to decrease the alkali solubility of the novolak resin, when decomposed by irradiation with light, it produces an alkali-soluble substance and actually serves to increase the alkali solubility of the novolak resin. Because of these changes in properties by irradiatioin with light, the naphthoquinonediazide compound is particularly useful as a light-sensitive material for a positive type photoresist.

In these circumstances, a number of positive type photoresists containing a novolak resin and a naphthoquinonediazide-based light-sensitive material have been developed and put into practical use. They are sufficiently satisfactory for fabrication of line widths up to about 1.5 to 2 μm.

With an increase in the degree of integration for integrated circuits, fabrication of a super fine pattern comprising lines having a width of 1 μm or less is needed in the production of semiconductor substrates, e.g., super LSI. In such applications, a high sensitivity photoresist is needed in terms of high resolving power, high pattern reproduction accuracy to accurately reproduce the form of a light exposure mask, and high productivity. The conventional positive type photoresist, however, fails to meet the above requirements.

SUMMARY OF THE INVENTION

A first object of the present invention is to provide a positive type photoresist composition having a high resolving power, particularly for use in production of semiconductor devices.

A second object of the present invention is to provide a positive type photoresist composition capable of accurately reproducing mask dimensions over a wide photomask line width range.

A third object of the present invention is to provide a positive type photoresist composition capable of forming a resist pattern in a cross-sectional form having a high aspect ratio in a pattern having a line width of not more than 1 μm.

A fourth object of the present invention is to provide a positive type resist composition capable of forming a pattern in the form that the side wall of the pattern cross section is nearly vertical.

A fifth object of the present invention is to provide a positive type photoresist composition having a wide developing latitude.

Yet another object of the present invention is to provide a positive type photoresist providing a resist image having excellent heat resistance.

These and other objects are attained by a positive type photoresist composition containing:

at least one light-sensitive material represented by the general formula (I), (II) or (III); and an alkali-soluble novolak resin.

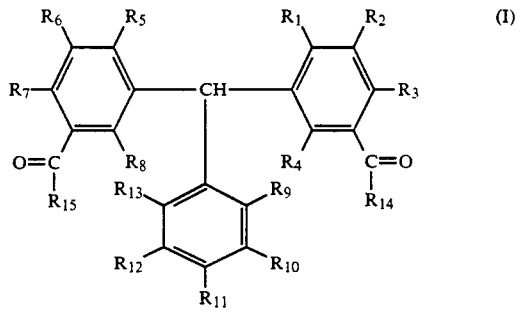

wherein:

$R_1$ to $R_{13}$ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group,

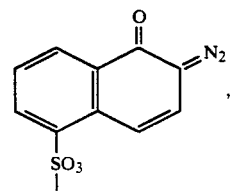

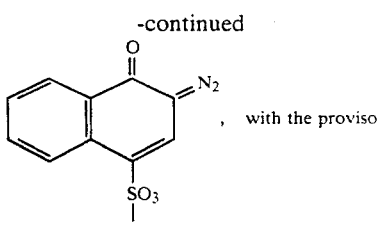, with the proviso

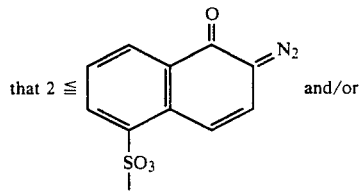 and/or

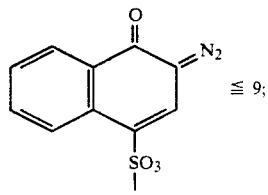 ≦ 9;

and

R$_{14}$ and R$_{15}$ can be the same or different and each is a substituted or unsubstituted alkyl group, a substituted or unsubstituted alkoxy group, a substituted or unsubstituted aryl group, a substituted or unsubstituted aryloxy group, a substituted or unsubstituted aralkyl group, or a substituted or unsubstituted aralkyloxy group.

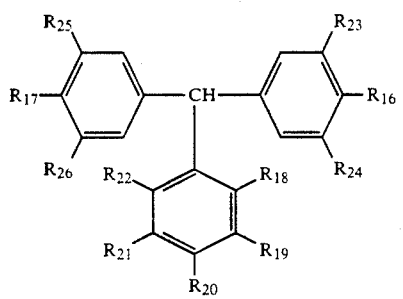 (II)

wherein;
R$_{16}$ and R$_{17}$ may be the same or different and each is —OH,

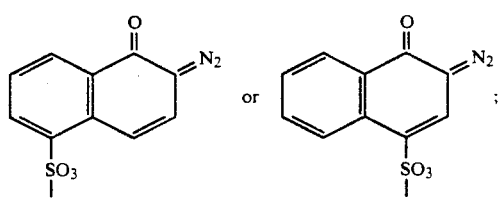;

R$_{18}$ to R$_{22}$ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group,

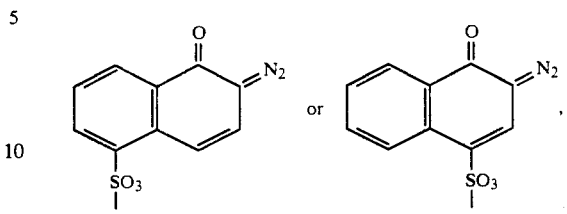

and

R$_{23}$ to R$_{26}$ can be the same or different and each is a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group, with the proviso that

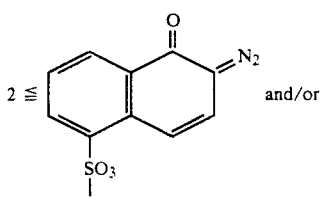 and/or

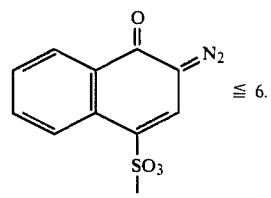 ≦ 6.

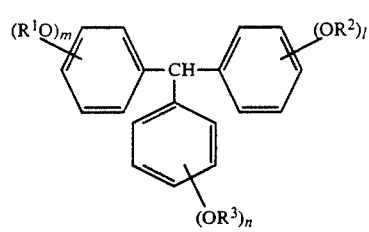 (III)

wherein R$^1$, R$^2$ and R$^3$, may be the same or different and each is —H,

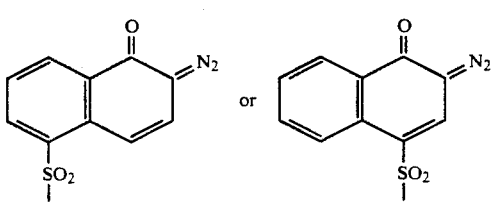

with the proviso that

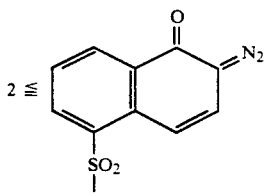

and/or

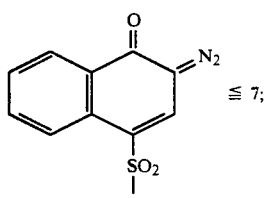

and l, m and n each represents integers provided that $5 \leq l+m+n \leq 7$, further provided that two of l, m and n are not 3 at the same time.

DETAILED DESCRIPTION OF THE INVENTION

The light-sensitive materials represented by the general formulae (I), (II) and (III) are obtained by reacting polyhydroxytriphenylmethane-based compounds represented by the general formulae (I'), (II') and III') with 1,2-naphthoquinonediazido-5-sulfonyl chloride and/or 1,2-naphthoquinonediazide-4-sulfonyl chloride.

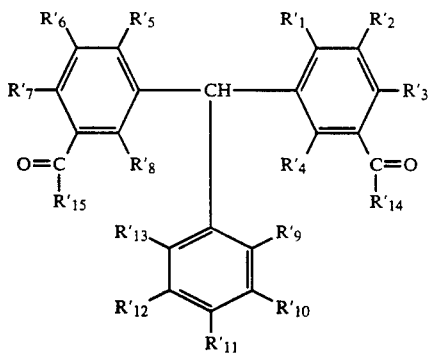

wherein $R'_1$ to $R'_{13}$ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group with the proviso that $2 \leq$ —OH$\leq 9$; $R'_{14}$ and $R'_{15}$ may be the same or different and each is a substituted or unsubstituted alkyl group, a substituted or unsubstituted alkoxy group, a substituted or unsubstituted aryl group, a substituted or unsubstituted aryloxy group, a substituted or unsubstituted aralkyl group or a substituted or unsubstituted aralkyloxy group.

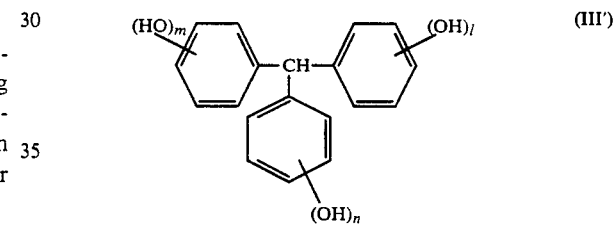

wherein $R'_{16}$ and $R'_{17}$ each is —OH; $R'_{18}$ to $R'_{22}$ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group or a substituted or unsubstituted aralkyloxy group; and $R'_{23}$ to $R'_{26}$ can be the same or different and each is a substituted or unsubstituted alkyl group, a substituted or unsubstituted alkoxy group, a substituted or unsubstituted aryl group, a substituted or unsubstituted aryloxy group, or a substituted or unsubstituted aralkyl group, a substituted or unsubstituted aralkyloxy group with the proviso that $2 \leq$ —OH$\leq 6$.

(III')

wherein $5 \leq l+m+n \leq 7$ with the proviso that two of l, m and n are not 3 at the same time.

The compounds represented by the general formulae (I'), (II') and (III') are obtained by condensing substituted or unsubstituted phenols with substituted or unsubstituted benzaldehydes by the method of J.E. Driver et al. *J. Chem. Soc.*, 1954, pp. 985-989.

Of the substituted or unsubstituted alkyl, alkoxy, aryl, aryloxy, aralkyl and aralkyloxy groups represented by the $R_1 \sim R_{13}$, $R_1' \leq R_{13}'$, $R_{18} \leq R_{22}$, $R_{18}' \leq R_{22}'$, an alkyl group having 1 to 8 carbon atoms; an alkoxy group having 1 to 8 carbon atoms; an aryl group having 6 to 15 carbon atoms; an aryloxy group having 6 to 15 carbon atoms; an aralkyl group having 7 to 15 carbon atoms; an aralkyloxy group having 7 to 15 carbon atoms; an alkyl or alkoxy group having 1 to 8 carbon atoms and being substituted with an alkoxy group, an aryloxy group, an aryl group, a hydroxy group, a carboxy group, a sufonic acid group, an amino group, a nitro group, a silyl group, a silylether group, a cyano group, an aldehyde group, a mercapto group or a halogen atom; or an aryl (having 6 to 15 carbon atoms), aryloxy (having 6 to 15 carbon atoms), aralkyl (having 7 to 15 carbon atoms) or aralkyloxy (having 7 to 15 carbon atoms) group substituted with an alkoxy group, an aryloxy group, an aryl group, a hydroxy group, a carboxy group, a sulfonic acid group, an amino group, a nitro group, a silyl group, a silylether group, a cyano group, an aldehyde group, a mercapto group or a halogen atom, is preferred.

Of the substituted or unsubstituted alkyl, alkoxy, aryl, aryloxy, aralkyl and aralkyloxy groups represented by the $R_{14}$, $R_{15}$, $R_{14}'$, $R_{15}'$, $R_{23} \leq R_{26}$, and $R_{23}' \leq R_{26}'$, an alkyl group having 1 to 8 carbon atoms; an alkoxy group having 1 to 8 carbon atoms; an aryl group having 6 to 15 carbon atoms; an aryloxy group having 6 to 15 carbon atoms; an aralkyl group having 7 to 15 carbon atoms; an aralkyloxy group having 7 to 15 carbon atoms; an alkyl or alkoxy group having 1 to 8 carbon atoms and being substituted with an alkoxy group, an aryloxy group, an aryl group, a sufonic acid group, an amino group, a nitro group, a silyl group, a silylether group, a cyano group, an aldehyde group, a mercapto group or a halogen atom; or an aryl (having 6 to 15 carbon atoms), aryloxy (having 6 to 15 carbon atoms), aralkyl (having 7 to 15 carbon atoms) or raralkyloxy (having 7 to 15 carbon atoms) group substituted with an alkoxy group, an aryloxy group, an aryl group, a hydroxy group, a carboxy group, a sulfonic acid group, an amino group, a nitro group, a silyl group, a silylether group, a cyano group, an aldehyde group, a mercapto group or a halogen atom, is preferred.

The esterification reaction between the polyhydroxytriphenylmethane-based compounds represented by the general formulae (I'), (II') and (III') and 1,2-naphthoquinonediazido-5-sulfonyl chloride or 1,2-naphthoquinonediazido-4-sulfonyl chloride is carried out by a conventional method. A predetermined amount of a polyhydroxytriphenylmethane-based compound represented by the general formula (I'), (II') or (III') and 1,2-naphthoquinonediazido-5-sulfonyl chloride or 1,2-naphthoquinonediazido-4-sulfonyl chloride, and a solvent, i.e., dioxane, acetone, methyl ethyl ketone, or N-metylpyrroldone, are placed in a flask, and condensed by adding dropwise a basic catalyst, e.g., sodium hydroxide, sodium carbonate, sodium hydrogencarbonate, or triethylamine. The product thus obtained is washed with water, and then purified and dried. By the above method, the light-sensitive materials represented by the general formulae (I'), (II') and (III') can be prepared.

In the above esterification reaction, a mixture of compounds in which the number of esterification and the esterification position are different is obtained. Thus the degree of esterification as used herein is defined as a mean value of the mixture.

The degree of esterification is controlled by varying the mixing ratio of the starting material of the general formula (I), (II) or (III) to 1,2-naphthoquinonediazido-5 (and/or -4)-sulfonyl chloride. That is, since all of the added 1,2-naphthoquinonediazido-5 (and/or -4)-sulfonyl chloride substantially undergoes the esterification reaction, it suffices that the molar ratio of the starting materials are controlled in order to obtain a mixture having the desired degree of esterification.

The alkali-soluble novolak resin used in the present invention is obtained by addition condensation reaction of 1 mol of phenols and from about 0.6 to about 1.0 mol of aldehydes in the presence of an acidic catalyst. As the phenols, phenol, o-cresol, m-cresol, p-cresol, and xylenol can be used alone or in combination with each other. As the aldehydes, formaldehyde, paraformaldehyde or furfural can be used. As the acidic catalyst, hydrochloric acid, sulfuric acid, formic acid, oxalic acid and acetic acid can be used. The novolak resin thus obtained, having a molecular weight of about 1,000 to about 50,000, is alkali-soluble.

In connection with the ratio of the light-sensitive material to the alkali-soluble novolak resin in the present invention, the amount of the light-sensitive material used is from about 5 to about 100 parts by weight and preferably from about 10 to about 50 parts by weight per 100 parts by weight of the novolak resin. If the ratio is less than about 5 parts by weight, the remaining film ratio is greatly decreased. On the other hand, if it is more than 100 parts by weight, the sensitivity and the solubility in solvents are decreased.

In the present invention, the aforementioned light-sensitive material is mainly used. If necessary, other known light-sensitive materials, e.g., ester compounds of 2,3,4-trihydroxybenzophenone, 2,4,4'-trihydroxybenzophenone, 2,4,6-trihydroxybenzophenone and the like, and 1,2-naphthoquinonediazide-4- (and/or -5-)sulfonyl chloride can be used in combination. In this case, the additional light-sensitive material can be used in an amount of not more than about 100 parts by weight, preferably not more than about 30 parts by weight per 100 parts by weight of the light-sensitive material of the general formula (I), (II) and/or (III).

In the present invention, a polyhydroxy compound can be added to accelerate the dissolution of the resist into the developer. Preferred polyhydroxy compounds include phenols such as phenol, alkyl-substituted phenol, e.g., m-cresol, p-cresol, o-cresol, etc., halogen-substituted phenol, e.g., chlorophenol, etc., resorcin, phloroglucin, 2,3,4-trihydroxybenzophenone, 2,3,4,4'-tetrahydroxybenzophenone, 2,3,4,3',4',5'-hexahydroxybenzophenone, and an acetone-pyrrogalol condensation resin.

Solvents which can be used to dissolve the light-sensitive material and the alkali-soluble novolak resin of the present invention include ketones such as methyl ethyl ketone and cyclohexanone; alcohol ethers such as ethylene glycol monomethylether and ethylene glycol monoethyl ether; ethers such as dioxane and ethylene glycol dimethyl ether; cellosolve esters such as methylcellosolve acetate and ethylcellosolve acetate; fatty acid esters such as methyl lactate, ethyl lactate and butyl acetate, halogenated hydrocarbons such as 1,1,2-trichloroethylene, and high polar solvents such as dimethylacetamide, N-methylpyrrolidone, dimethylformamide and dimethylsulfoxide. These solvents can be used alone or in combination with each other.

Added to the positive type photoresist composition of the present invention can be a dye, a plasticizer, an adhesive, a surfactant and the like, if desired. Specific examples are dyes such as Methyl Violet, Crystal Violet, and Malachite Green; plasticizers such as stearic acid, an acetal resin, a phenoxy resin and an alkyd resin; adhesion aids such as hexamethyldisilazane and chloromethylsilane, and surfactants such as nonylphenoxy poly(ethyleneoxy)ethanol and octylphenoxy poly(ethyleneoxy)ethanol.

A good photoresist can be obtained by coating the above positive type photoresist composition on a substrate (e.g., silicon/silicon dioxide coating) as used in production of fine integrated circuit elements by a suitable coating method, e.g., a method using spinner or coater, and then exposing to light through a predetermined mask and developing.

As the developer for the positive type photoresist composition of the present invention, aqueous solutions of an inorganic alkali such as sodium hydroxide, potassium hydroxide, sodium carbonate, sodium silicate, sodium metasilicate and ammonia water; primary amines such as ethylamine and n-propylamine; secondary amines such as diethylamine and di-n-butylamine, tertiary amines such as triethylamine and methyldiethylamine, alcoholamines such as dimethylethanol amine and triethanolamine; quaternary ammonium salts such as tetramethylammonium hydroxide and tetraethylammonium hydroxide, and cyclic amines such as pyrrole and piperidine, can be used. To the aqueous alkali solution can be added a suitable amount of one or more alcohols or a surfactant.

The positive type photographic composition of the present invention is coated on a semiconductor wafer or a substrate, e.g., glass, ceramics or metal in a thickness of 0.5 to 3 μm by spin coating or roller coating. After heating and drying of the coating, a circuit pattern, for example, is printed by irradiating with ultraviolet rays through an exposure mask, which is then developed to obtain a positive image pattern. Further, by applying etching with the positive image as a mask, the pattern is produced in the substrate. Typical application fields are the production of semiconductors, e.g., IC, the production of circuit substrate, e.g., liquid crystal and thermal heads, and the photofabrication.

The positive type photoresist of the present invention has excellent resolving power, faithful reproductivity, cross-sectional form of resist image, developing latitude, and heat resistance.

The present invention is described in greater detail with reference to the following examples. Unless otherwise indicated, all parts, percents, ratios and the like are by weight.

EXAMPLES 1 TO 6, AND COMPARATIVE EXAMPLES 7 TO 9

(1) Preparation of Light-Sensitive Material (a)

10 g of 4,4′,3″,4″-tetrahydroxy-3,5,3′,5′-tetramethyltriphenylmethane, 18.9 g of 1,2-naphthoquinonediazido-5-sulfonyl chloride and 300 ml of acetone were placed in a three-necked flask and uniformly dissolved. Then, a mixed solution of triethylamine/acetone equal to 7.5 g/30 ml was gradually added thereto, and the reaction was carried out at 25° C. for 3 hours. The reaction mixture was poured into 1,500 ml of a 1% aqueous hydrochloric acid solution. The precipitate thus formed was filtered off, washed with water and dried at 40° C. to obtain 23 g of the 1,2-naphthoquinonediazido-5-sulfonic acid ester of 4,4′,3″, 4″-tetrahydroxy-3,5,3′,5′-tetramethyltriphenylmethane.

(2) Preparation of Light-Sensitive Material (b)

10 g of 4,4′,2″,3″,4″-pentahydroxy-3,5,3′,5′-tetramethyltriphenylmethane, 24.7 g of 1,2-naphthoquinonediazido-5-sulfonyl chloride and 350 ml of acetone were placed in a three-necked flask and uniformly dissolved. Then, a mixed solvent of triethylamine/acetone equal to 9.8 g/30 ml was gradually added thereto, and the reaction was carried out at 25° C. for 3 hours. The reaction mixture was poured into 1,750 ml of a 1% aqueous hydrochloric acid solution. The precipitate thus formed was filtered off, washed with water and dried at 40° C to obtain 28 g of the 1,2-naphthoquinonediazido-5-sulfonic acid ester of 4,4′,2″,3″,4″-pentahydroxy-3,5,3′.5′-tetramethyltriphenylmethane.

(3) Preparation of Light-Sensitive Material (c)

10 g of 2,4,6,2′,4′,6′-hexahydroxy-5,5′-dipropionyltriphenylmethane, 28.5 g of 1,2-naphthoquinonediazido-5-sulfonyl chloride and 350 ml of acetone were placed in a three-necked flask and uniformly dissolved. Then, a mixed solvent of triethylamine/acetone equal to 11.3 g/30 ml was gradually added thereto, and the reaction was carried out at 25° C. for 3 hours. The reaction mixture was poured into 1,750 ml of a 1% aqueous hydrochloric acid solution. The precipitate thus formed was filtered off, washed with water and dried at 40° C. to obtain 31.6 g of the 1,2-naphthoquinonediazido-5-sulfonic acid ester of 2,4,6,2′,4′,6′-hexahydroxy-5,5′-dipropionyltriphenylmethane.

(4) Preparation of Light-Sensitive Material (d)

10 g of 2,3,4,2′3′4′,3″,4″-octahydroxy-5,5′-diacetyl triphenylmethane, 37.7 g of 1,2-naphthoquinonediazido-5-sulfonyl chloride and 400 ml of acetone were placed in a three-necked flask and uniformly dissolved. Then, a mixed solvent of triethylamine/acetone equal to 14.9 g/30 ml was gradually added thereto, and the reaction was carried out at 25° C. for 3 hours. The reaction mixture was poured into 2,000 ml of a 1% aqueous hydrochloric acid solution. The precipitate thus formed was filtered off, washed with water and dried at 40° C. to obtain 38.2 g of the 1,2-naphthoquinonediazido-5-sulfonic acid ester of 2,3,4,2′,3′,4′, 3″,4″-ocatahydroxy-5,5′-diacetyltriphenylmethane.

(5) Preparation of Light-Sensitive Material (e)

10 g of 2,4,6,2′,4′,6′,2″,3″,4″-nonahydroxy-5,5′-dipropionyltriphenylmethane, 36.3 g of 1,2-naphthoquinonediazido-5-sulfonyl chloride and 400 ml of acetone were placed in a three-necked flask and uniformly dissolved. Then, a mixed solvent of triethylamine/ acetone equal to 14.4 g/30 ml was gradually added thereto, and the reaction was carried out at 25° C. for 3 hours. The reaction mixture was poured into 2,000 ml of a 1% aqueous hydrochloric acid solution. The precipitate thus formed was filtered off, washed with water and dried at 40° C. to obtain 39.4 g of the 1,2-naphthoquinonediazido-5-sulfonic acid ester of 2,4,6,2′,4′,6′, 2″,3″,4″-nonahydroxy-5,5′-dipropionyltriphenylmethane.

(6) Preparation of light-Sensitive Material (f)

10 g of 2,4,2′,4′,2″,3″,4″-heptahydroxytriphenylmethane, 30.6 g of 1,2-naphthoquinonediazido-5-sulfonyl chloride and 350 ml of acetone were placed in a three-necked flask and uniformly dissolved. Then, a mixed solvent of triethylamine/acetone equal to 12.1 g/30 ml was gradually added thereto, and the reaction was carried out at 25° C. for 3 hours. The reaction mixture was poured into 1,750 ml of a 1% aqueous hydrochloric acid solution. The precipitate thus formed was filtered off, washed with water and dried at 40° C. to obtain 33.7 g of the 1,2-naphthoquinonediazido-5-sulfonic acid ester of 2,4,2′,4′,2″,3″,4″-heptahydroxytriphenylmethane.

(7) Preparation of light-Sensitive Material (g)

(Comparative Example)

10 g of 2,3,4,4′-tetrahydroxybenzophenone, 30 g of 1,2-naphthoquinonediazido-5-sulfonyl chloride and 300 ml of acetone were placed in a three-necked flask and uniformly dissolved. Thereinto, a mixed solvent of triethylamine/acetone equal to 11.3 g/30 ml was gradually poured, and the reaction was carried out at 25° C. for 3 hours. The reaction mixture was poured into 1,500 ml of a 1% aqueous hydrochloric acid solution. The precipitate thus formed was filtered off, washed with water and dried at 40° C. to obtain 32.8 g of the 1,2-naphthoquinonediazido-5-sulfonic acid ester of 2,3,4,4'-tetrahydroxybenzophenone.

(8) Preparation of light-Sensitive Material (h)

(Comparative Example)

10 g of 2,4,2',4'-tetrahydroxytriphenylmethane, 17.4 g of 1,2-naphthoquinonediazido-5-sulfonyl chloride and 250 ml of acetone were placed in a three-necked flask and uniformly dissolved. Thereinto, a mixed solvent of triethylamine/acetone equal to 6.9 g/30 ml was gradually poured, and the reaction was carried out at 25° C. for 3 hours. The reaction mixture was poured into 1,250 ml of a 1% aqueous hydrochloric acid solution. The precipitate thus formed was filtered off, washed with water and dried at 40° C. to obtain 23 g of the 1,2-naphthoquinonediazido-5-sulfonic acid ester of 2,4,2',4'-tetrahydroxytriphenylmethane.

(9) Preparation of Light-Sensitive Material (i)

(Comparative Example)

10 g of 2,3,4,2',3',4'-hexahydroxytriphenylmethane, 39.5 g of 1,2-naphthoquinonediazido-5-sulfonyl chloride and 400 ml of acetone were placed in a three-necked flask and uniformly dissolved. Thereinto, a mixed solvent of triethylamine/acetone equal to 15.6 g/30 ml was gradually poured, and the reaction was carried out at 25° C. for 3 hours. The reaction mixture was poured into 2,000 ml of a 1% aqueous hydrochloric acid solution. The precipitate thus formed was filtered off, washed with water and dried at 40° C. to obtain 40.1 g of the 1,2-naphthoquinonediazido-5-sulfonic acid ester of 2,3,4,2',3',4'-hexahydroxytriphenylmethane.

TABLE 1

| | | Light-Sensitive material | Esterification Ratio % |
|---|---|---|---|
| Example | | | |
| 1 | a | 1,2-naphthoquionediazidosulfonic acid ester of 4,4'3",4",tetrahydroxy-3,5,3',5'-tetramethyltriphenylmethane | 64 |
| 2 | b | 1,2-naphthoquinonediazidosulfonic acid ester of 4,4',2",3",4"-pentahydroxy-3,5,3',5'-tetramethyltriphenylmethane | 70 |
| 3 | c | 1,2-naphthoquinonediazidosulfonic acid ester of 2,4,6,2',4',6'-hexahydroxy-5,5'-dipropionyltriphenylmethane | 80 |
| 4 | d | 1,2-naphthoquinonediazidosulfonic acid ester of 2,3,4,2',3',4',3",4"-octahydroxy-5,5'-diacetyltriphenylmethane | 80 |
| 5 | e | 1,2-naphthoquinonediazidosulfonic acid ester of 2,4,6,2',4',6',2", 3",4"-nonahydroxy-5,5'-dipropionyltriphenylmethane | 75 |
| 6 | f | 1,2-naphthoquinonediazidosulfonic acid ester of 2,4,2',4',2",3",4"-heptahydroxytriphenylmethane | 58 |
| Comparative Example | | | |
| 1 | g | 1,2-naphthoquinonediazidosulfonic acid ester of 2,3,4,4'-tetrahydroxybenzophenone | 69 |
| 2 | h | 1,2-naphthoquinonediazidosulfonic acid ester of 2,4,2',4'-tetrahydroxytriphenylmethane | 50 |
| 3 | i | 1,2-naphthoquinonediazidosulfonic acid ester of 2,3,4,2',3',4'-hexahydroxytriphenylmethane | 83 |

(10) Production of Novolak Resin 40 g of methacresol, 60 g of p-cresol, 49.5 g of a 37% aqueous formalin solution and 0.05 g of oxalic acid were placed in a three-necked flask and heated to 100° C. while stirring, at which the reaction was carried out for 7 hours. After the reaction, the reaction mixture was cooled to room temperature and reduced in pressure to 30 mmHg. Then, the mixture was gradually heated to 150° C., and water and unreacted monomers were removed. The weight average molecular weight of the novolak resin was 8,000 (calculated as polystyrene).

Preparation and Evaluation of Positive Type Photoresist Composition 7 1.25 g of each of the light-sensitive materials (a) to (i) shown in Table 1 which had been obtained in (1) to (9) above, respectively, and 5 g of the cresolnovolak resin (molecular weight: 8,000) as obtained in (10) above, were dissolved in 15 g of ethylcellosolve acetate and passed through a 0.2 μm microfilter to prepare a photoresist composition. This photoresist was coated on a silicone wafer by the use of a spinner and dried in a convection oven in a nitrogen atmosphere at 90° C. for 30 minutes to obtain a resist film having thickness of 1.5 μm. This film was exposed to light by the use of a reduction projection exposing apparatus (NSR1505G, produced by Nikon Co., Ltd.), and then developed with a 2.38% aqueous tetramethylammonium hydroxide solution for one minute, washed with water for 30 seconds and dried. The resist pattern on the silicone wafer as obtained above was observed with a scanning type electron microscope to evaluate the resist. The results are shown in Table 2.

TABLE 2

| | Light-Sensitive Material | Relative Sensitivity | Film Remaining Ratio (%) | Resolving Power (μm) | Heat Resistance (°C.) | Resist Form (θ) |
|---|---|---|---|---|---|---|
| Example 1 (present invention) | a | 1.1 | 99 | 0.7 | 150 | 86 |
| 2 | b | 1.2 | 100 | 0.7 | 150 | 87 |
| 3 | c | 1.1 | 99 | 0.7 | 150 | 89 |
| 4 | d | 1.3 | 100 | 0.6 | 160 | 89 |
| 5 | e | 1.5 | 100 | 0.6 | 160 | 86 |
| 6 | f | 1.6 | 99 | 0.7 | 150 | 85 |
| Comparative Example 1 | g | 1.0 | 98 | 0.8 | 140 | 82 |
| 2 | h | 0.9 | 96 | 0.8 | 130 | 77 |

TABLE 2-continued

| Light-Sensitive Material | Relative Sensitivity | Film Remaining Ratio (%) | Resolving Power (μm) | Heat Resistance (°C.) | Resist Form (θ) |
|---|---|---|---|---|---|
| 3 | i | 0.8 | 97 | 0.8 | 140 | 83 |

The sensitivity is defined a reciprocal of an exposure amount to reproduce a mask pattern of 2.0 μm, and is indicated as a relative value with that of Comparative Example 1 as a base.

The film remaining ratio is indicated as a percentage of the ratio of unexposed area before and after development. The resolving power indicates a critical resolving power at an exposure amount to reproduce a mask pattern of 2.0 μm.

The heat resistance indicates a temperature at which the deformation of the pattern does not occur when the silicone wafer with the resist formed thereon in a pattern form is baked in a convection oven for 30 minutes. The form of the resist is indicated as an angle between the resist wall surface and the plane surface of the silicone wafer in the cross section of the resist pattern of 1.0 μm.

It can be seen that the resists using the light-sensitive materials (a) to (f) of the present invention are excellent in resolving power and resist form. The light-sensitive material of the present invention also has excellent solubility in ethyl-cellosolve acetate. Even if the resist composition solution using the light-sensitive materials was allowed to stand at 40° C. for 30 days, no precipitate was formed. On the contrary, when the resist composition solution using the light-sensitive material (i) of Comparative Example was allowed to stand under the same conditions as above, deposition of a precipitate was observed While the invention has been described in detail and with reference to specific embodiments thereof, it will be apparent to one skilled in the art that various changes and modifications can be made therein without departing from the spirit and scope thereof.

What is claimed is:

1. A positive type photoresist composition containing at least one light-sensitive material represented by the general formulae (I) to (III) and an alkali-soluble novolak resin in admixture, wherein said light-sensitive material is present in an amount of from about 5 to 100 parts by weight per 100 parts by weight of said novolak resin:

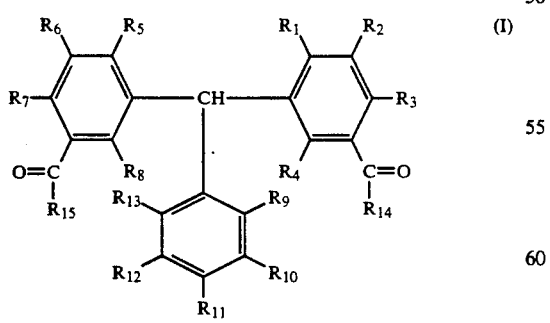

wherein $R_1$ to $R_{13}$ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group,

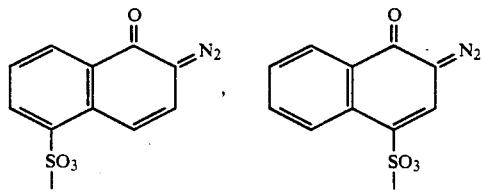

with the proviso that

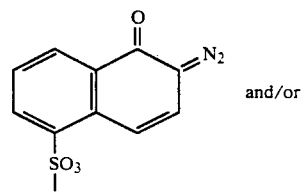 and/or

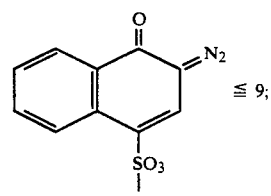

and
$R_{14}$ and $R_{15}$ can be the same or different and each is a substituted or unsubstituted alkyl group, a substituted or unsubstituted alkoxy group, a substituted or unsubstituted aryl group, a substituted or unsubstituted aryloxy group, a substituted or unsubstituted aralkyl group, or a substituted or unsubstituted aralkyloxy group:

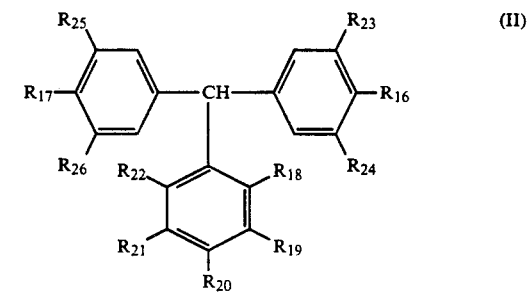

wherein;
$R_{16}$ and $R_{17}$ may be the same or different and each is —OH,

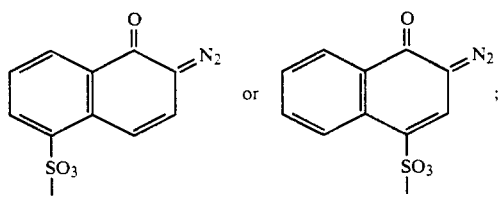 or 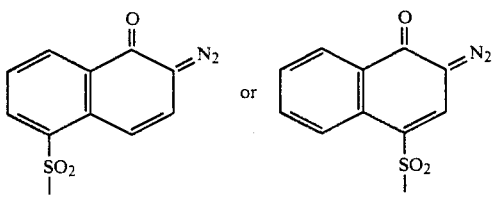 or $R_{18}$ to $R_{22}$ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group,

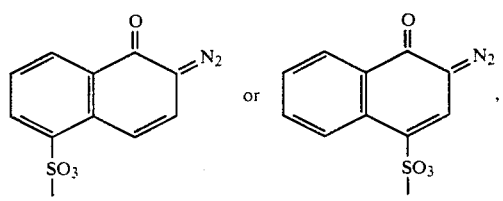 or , and
$R_{23}$ to $R_{26}$ can be the same or different and each is a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group, with the proviso that

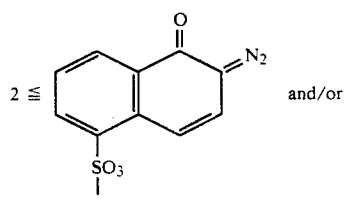 and/or

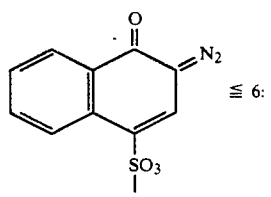 $\leq 6$:

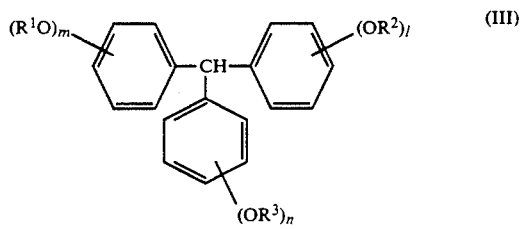

wherein $R^1$, $R^2$ and $R^3$, may be the same or different and each is —H, with the proviso that

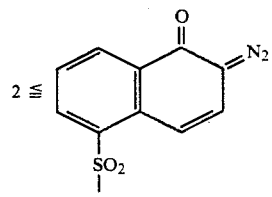 $2 \leq$ and/or

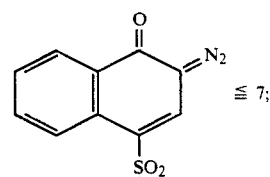 $\leq 7$;

and
l, m and n each represents integers provided that $6 \leq l+m+n \leq 7$, further provided that two of l, m and n are not 3 at the same time and each of l, m and n are at least 1.

2. A positive type photoresist composition containing a light-sensitive material represented by the general formula (I) and an alkali-soluble novolak resin in admixture, wherein said light-sensitive material is present in an amount of from about 5 to 100 parts by weight per 100 parts by weight of said novolak resin:

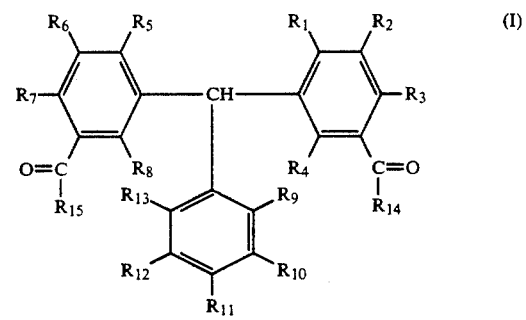

wherein $R_1$ to $R_{13}$ may be the same or different and each is —H, —OH, a substituted or unsubstituted alkyl group, a substituted or unsubstituted alkoxy group, a substituted or unsubstituted aryl group, a substituted or unsubstituted aryloxy group a substituted or unsubstituted aralkyl group, a substituted or unsubstituted aralkyloxy group,

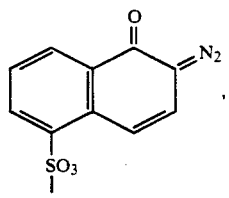 , 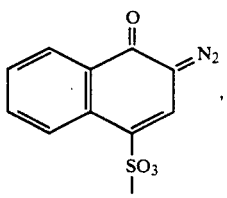 , with the proviso that $2 \leq$ 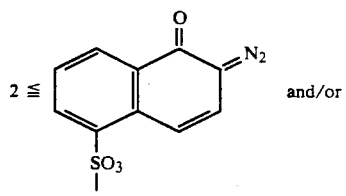 and/or

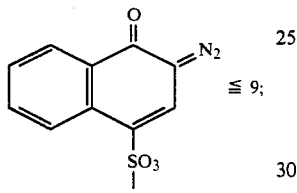 $\leq 9$;

and

R₁₄ and R₁₅ can be the same or different and each is a substituted or unsubstituted alkyl group, a substituted or unsubstituted alkoxy group, a substituted or unsubstituted aryl group, a substituted or unsubstituted aryloxy group, a substituted or unsubstituted aralkyl group, or a substituted or unsubstituted aralkyloxy group.

3. A positive type photoresist composition containing a light-sensitive material represented by the general formula (II) and an alkali-soluble novolak resin in admixutre, wherein said light-sensitive material is present in an amount of from about 5 to 100 parts by weight per 100 parts by weight of said novolak resin:

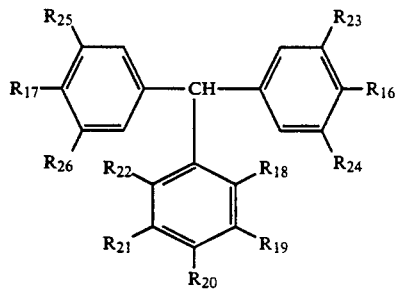 (II)

wherein,

R₁₆ and R₁₇ may be the same or different and each is —OH,

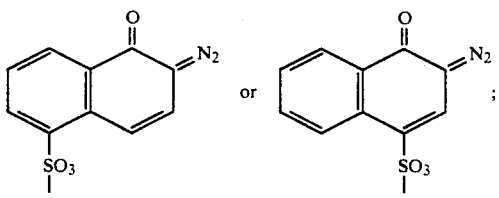 or 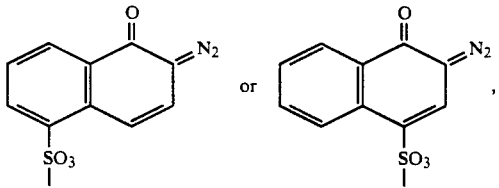 ;

R₁₈ to R₂₂ may be the same or different and each is —H, —OH, a substituted or unsubstituted alkyl group, a substituted or unsubstituted alkoxy group, a substituted or unsubstituted aryl group, a substituted or unsubstituted aryloxy group, a substituted or unsubstituted aralkyl group, a substituted or unsubstituted aralkyloxy group,

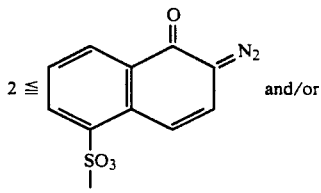 or 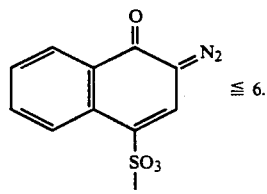 , and

R₂₃ to R₂₆ can be the same or different and each is a substituted or unsubstituted alkyl group, a substituted or unsubstituted alkoxy group, a substituted or unsubstituted aryl group, a substitute or unsubstituted aryloxy group, a substituted or unsubstituted aralkyl group, a substituted or unsubstituted aralkyloxy group, with the proviso that $2 \leq$ [structure] and/or

[structure] $\leq 6$.

4. A positive type photoresist composition containing a light-sensitive material represented by the general formula (III) and an alkali-soluble novolak resin in admixture, wherein said light-sensitive material is present in an amount of from about 5 to 100 parts by weight per 100 parts by weight of said novolak resin:

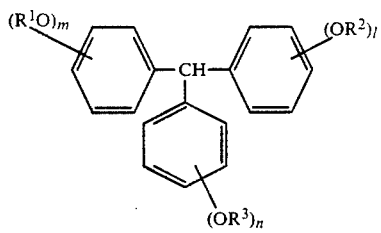
(III)

wherein $R^1$, $R^2$ and $R^3$, may be the same or different and each is —H,

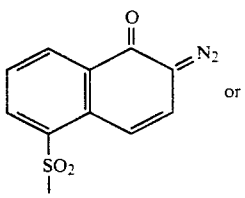 or

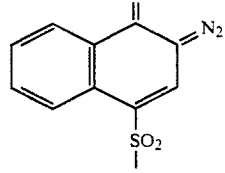

with the proviso that

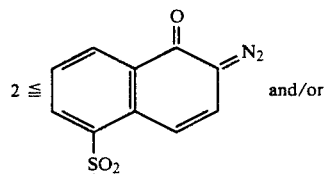 and/or

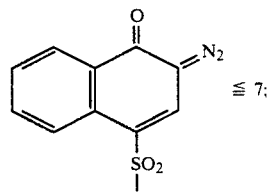

and l, m and n each represents integers provided that $6 \leq l+m+n \leq 7$, further provided that two of l, m and n are not 3 at the same time and each of l, m and n are at least 1.

5. A positive type photoresist composition as in claim 4, wherein $l+m+n=7$.

6. A positive type photoresist composition as in claim 1, wherein $l+m+n=7$ in general formula (III).

* * * * *